United States Patent

Frederiksen

[15] 3,649,846

[45] Mar. 14, 1972

[54] SINGLE SUPPLY COMPARISON AMPLIFIER

[72] Inventor: Thomas M. Frederiksen, Scottsdale, Ariz.

[73] Assignee: Motorola, Inc., Franklin Park, Ill.

[22] Filed: Jan. 7, 1971

[21] Appl. No.: 104,660

[52] U.S. Cl. ............................307/235, 330/30 D, 330/38 M

[51] Int. Cl. ............................H03k 5/20

[58] Field of Search ......................307/235; 330/30 D, 38 M; 328/151

[56] References Cited

UNITED STATES PATENTS

| | | | |
|---|---|---|---|
| 3,566,296 | 2/1971 | Liu | 330/30 D |
| 3,365,586 | 1/1968 | Billings | 307/235 |
| 3,487,323 | 12/1969 | Schaefer | 330/30 D |

OTHER PUBLICATIONS

IBM Technical Disclosure Bulletin Vol. 11, No. 7, Dec., 1968, p. 762- 763 " Simultaneous Bidirectional Baseband Data Transmission"

*Primary Examiner*—John Zazworsky
*Attorney*—Mueller & Aichele

[57] ABSTRACT

A monolithic integrated circuit comparison amplifier employs Darlington and modified Darlington connected PNP transistors in a differential circuit configuration to compare input voltages having a common-mode voltage range extending down to 0 volts. The comparison amplifier operates from a single voltage supply.

12 Claims, 2 Drawing Figures

PATENTED MAR 14 1972

3,649,846

INVENTOR.
THOMAS M. FREDERIKSEN

BY *Mueller & Aichele*

ATTORNEYS.

SINGLE SUPPLY COMPARISON AMPLIFIER

BACKGROUND OF THE INVENTION

Integrated differential comparison amplifier circuits currently are used in a large number of applications where it is desirable to provide an output indicative of which of two input signal levels is the greater. Many of these integrated comparison circuits operate with both positive and negative or split power supplies and therefore are capable of comparing input signals equal to, greater than, or less than 0 volts.

A problem arises, however, when only a single voltage supply is available, as in the case of a B+ power supply, the negative terminal of which is grounded. In such a situation, the use of conventional monolithic integrated circuit comparators with NPN transistors results in a comparator which is incapable of effecting a comparison below the level necessary to forward bias the base-emitter junctions of the comparison transistors. In many automotive and industrial control systems using only a single B+ power supply, this limitation is undesirable since the lower threshold of comparison is dictated by the characteristics of the comparator circuit itself rather than by the lowest possible levels which can be attained by the comparator inputs. It is desirable to have a monolithic integrated comparator circuit which is capable of operating from a single voltage supply and which also is capable of effecting an accurate comparison of two input signal levels in a common-mode voltage range which actually goes to 0 volts.

SUMMARY OF THE INVENTION

Therefore it is an object of this invention to provide an improved comparison circuit.

It is another object of this invention to provide a comparison circuit capable of effecting a valid comparison in a common-mode voltage range which goes to 0 volts.

It is a further object of this invention to provide a comparison circuit operating from a single power supply and capable of comparing input signals down to 0 volts.

It is an additional object of this invention to provide an improved monolithic integrated comparison circuit operating from a single voltage supply.

In accordance with a preferred embodiment of this invention a comparison circuit includes first, second, third and fourth transistors of the same conductivity type interconnected as a differential comparison amplifier. The first and third transistors are connected in a Darlington cascade configuration and the second and fourth transistors similarly are connected in a Darlington cascade with the first and second transistors constituting the Darlington output transistors interconnected as the differential comparison portion of the circuit. A source of DC operating current is connected to the emitters of the first and second transistors; and the collectors of the transistors are coupled with a point of reference potential, with the collector of the second transistor being coupled through an impedance to the point of reference potential. Input signals to be compared are applied to the bases of the third and fourth transistors, respectively, and output signals are obtained from the collector of the second transistor.

In a more specific embodiment of the invention, the comparison amplifier is a monolithic integrated circuit, with the transistors all being PNP transistors, so that the amplifier is capable of effecting an output indicative of a comparison of two input voltages extending all the way down to 0 volts or a ground reference potential.

DETAILED DESCRIPTION

Figure 1:
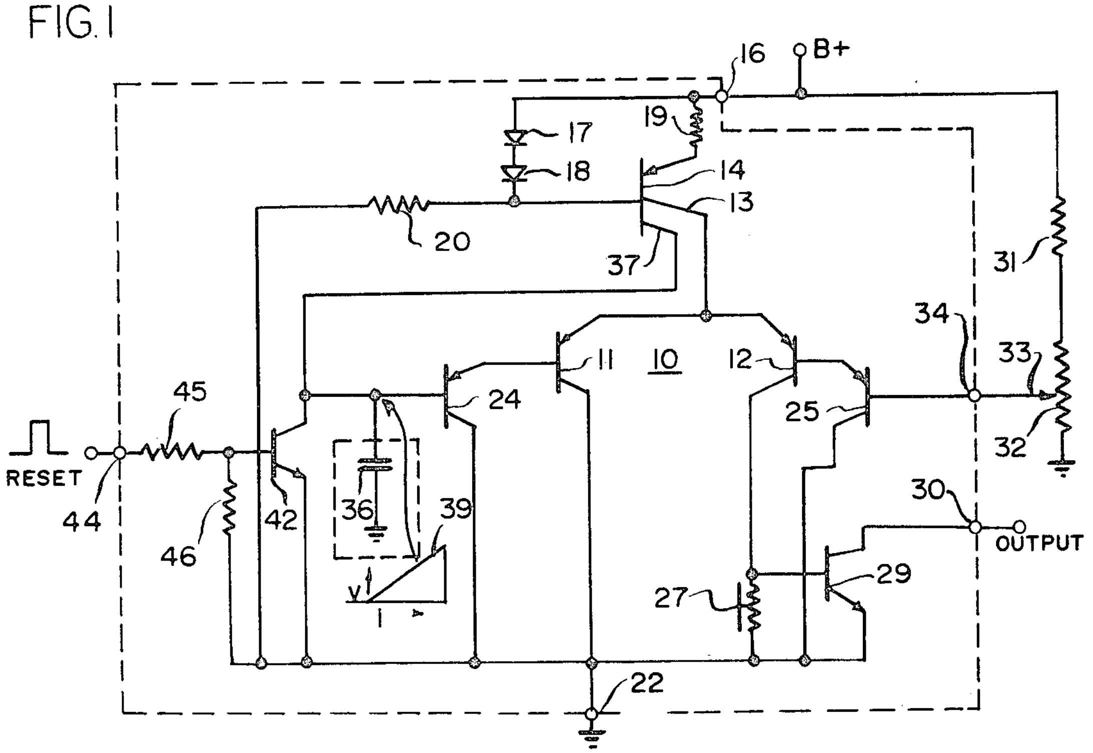
FIG. 1 is a detailed schematic diagram of a preferred embodiment of this invention.

Referring now to the drawing, wherein the same reference numerals are used in both figures to designate the same or similar components, there is shown a comparison circuit constructed as a monolithic integrated circuit which may be formed on a single chip or die or which may be formed as part of a larger integrated circuit including additional circuits for performing additional functions. The portions of the circuits shown in FIGS. 1 and 2 which are on the integrated circuit and form a part thereof are enclosed in dotted lines, with circuit elements located outside the integrated circuit chip being illustrated in the drawing as being outside the dotted lines.

In FIG. 1, the basic comparison circuit includes a differential amplifier 10, having a pair of lateral PNP transistors 11 and 12, the emitters of which are connected together at a common terminal to a first collector 13 of a dual-collector current source transistor 14 which provides operating current for the differential amplifier transistors 11 and 12. A single B+ power supply is provided for the comparison circuit on a power supply bonding pad 16 connected to the emitter of the transistor 14 through a resistor 19 and also connected to a voltage divider, including a pair of diodes 17 and 18 connected in series with a resistor 20 to a grounded bonding pad 22. The current source transistor 14 is a lateral PNP transistor and is used in the circuit to cause the current supplied to the comparison circuit to be relatively constant and immune to variations in the magnitude of the voltage supplied by the B+ power supply to the bonding pad 16.

The transistors 11 and 12 each constitute the output transistors of Darlington amplifier or modified Darlington amplifier circuits, including additional PNP input transistors 24 and 25, respectively, the emitters of which are connected to the bases of the transistors 11 and 12. In the circuit shown in FIG. 1, the transistors 11 and 24 are interconnected in a conventional Darlington amplifier configuration, and the collectors of both of these transistors are connected to the grounded bonding pad 22. The transistors 12 and 25, however, are interconnected in a modified Darlington amplifier configuration, since the collector of the transistor 12 is connected through a pinch resistor 27 to the grounded bonding pad 22, while the collector of the transistor 25 is connected directly to the bonding pad 22.

The pinch resistor 27 permits output signals to be obtained from the collector of the transistor 12; and the potential developed across the pinch resistor 27 is applied to the base of an NPN output transistor 29, the emitter of which is connected to the grounded bonding pad 22 and the collector of which provides output signals from the comparison circuit on an output bonding pad 30.

The comparison circuit operates such that when the potential applied to the base of the transistor 24 is higher (more positive) than that applied to the base of the transistor 25, the output transistor 12 is rendered conductive and the transistor 11 is rendered nonconductive. Under this set of conditions, current flows through the transistor 12 and develops a forward biasing potential across the pinch resistor 27 on the base of the NPN output transistor 29, rendering the output transistor 29 conductive. On the other hand, when the potential on the base of the transistor 25 is higher (more positive) than the potential applied to the base of the transistor 24, the transistor 11 of the differential amplifier 10 is rendered conductive, and the transistor 12 is nonconductive. Under this set of operating conditions, the output transistor 29 is nonconductive.

For the purpose of illustration, assume that the transistors 25 and 12 of the comparison amplifier constitute the reference transistors of the amplifier, with a DC reference potential being applied to the base of the transistor 25. One means for obtaining this reference potential is to utilize a voltage divider consisting of a resistor 31 connected in series with a potentiometer 32 between the B+ supply terminal and ground. An adjustable tap 33 on the potentiometer 32 is connected to the base of the transistor 25 to permit a variation in the DC voltage level applied to the base of the transistor 25 in a range extending from ground to a maximum determined by the relative values of the resistances of the resistor 31 and the potentiometer 32. When the tap 33 in its uppermost position, the full resistance of the potentiometer 32 is connected between the tap 33 and ground. The resistor 31 provides an upper limit to the potential which can be applied to the base of the transistor 25, with this upper limit being a predetermined amount lower than the B+ potential applied to the bonding pad 16. It should be noted, however, that no similar provision is made for establishing a lower limit, and that the tap 33 can be connected directly to ground which is the lowermost point of connection on the potentiometer 32 as illustrated in the drawings.

One manner of supplying input signals to the base of the transistor 24 on the other side of the comparison circuit is to apply a time varying voltage established by the increasing charge stored on a charge storage capacitor 36, connected between the base of the transistor 24 and ground. Charging current for the capacitor 36 is obtained from a second collector 37 of the PNP current source transistor 14 which supplies a predetermined current to charge the capacitor 36 at a predetermined rate as indicated by the waveform 39.

Assume that the circuit operation commences with the capacitor 36 fully discharged, so that the potential at the base of the transistor 24 is at ground potential. As the charge on the capacitor builds up in accordance with the current supplied from the collector 37 of the current source transistor 14, an increasing positive potential is applied to the base of the transistor 24. So long as this potential is lower or nearer ground than the reference potential applied to the base of the transistor 25, the transistors 11 and 12 are rendered conductive and the transistors 25 and 12 are nonconductive. Thus, the output transistor 29 also is nonconductive. When the potential on the base of the transistor 24 exceeds or is more positive than the potential applied to the base of the transistor 25 this set of operating conditions reverses. The transistors 11 and 24 then become nonconductive, with the transistors 12 and 25 becoming conductive to cause the output transistor 29 to conduct. This is a normal operation of a differential comparison circuit.

In the circuits shown in the drawing, however, the operation of the comparison amplifier 10 is capable of providing a reliable output even with the reference potential on the tap of the potentiometer 33 being all the way down to 0 volts or ground potential. With the tap on the potentiometer 33 at ground potential, the potential appearing on the emitter of the PNP transistor 25, with the transistors 12 and 25 being rendered conductive, is equal to a voltage of 1 $\phi$ (where $\phi$ equals $V_{BE}$, the voltage drop developed across the emitter-base junction of the transistor 25). This permits operation of the inside lateral PNP transistor 12 at a 0-volt collector-base biasing which then permits the collector of the transistor 12 also to be at a voltage of 1 $\phi$. This voltage with the transistor 12 being conductive is developed across the pinch resistor 27 and is sufficient to bias the output transistor 29 into conduction. Thus, the right hand or reference side of the comparison circuit including the transistors 12 and 25 is capable of providing a usable output through the transistor 29 with a zero reference voltage.

When the tap 33 on the potentiometer 32 is connected near to the ground end, as the varying signal voltage applied to the base of the transistor 24 on the left-hand side of the amplifier circuit exceeds the reference potential on the tap 33, the differential amplifier 10 will switch from a condition where the transistor 11 is conductive to a condition where the transistor 12 is conductive. As the tap 33 on the potentiometer 32 is moved upwards or nearer the junction of the potentiometer 32 with the resistor 31, an increasingly higher input voltage signal level is necessary on the base of the transistor 24 to cause switching of the transistors 11 and 12 from a condition where the transistor 11 is conductive to the condition where the transistor 12 is conductive.

A provision is made for resetting the amplifier by discharging the capacitor 36 through the collector-emitter path of an NPN discharge transistor 42. The base of the transistor 42 is supplied with positive reset pulses which may be obtained from any suitable source and which are applied to a reset bonding pad 44 through a coupling resistor 45. The transistor 42 normally is nonconductive since the base lead of this transistor is connected through a resistor 46 to the ground bonding pad 22. Thus, in the absence of a positive reset pulse on the bonding pad 44, the transistor 42 operates as an open circuit and has no affect on the operation of the remainder of the circuit.

It should be noted that the input transistors 24 and 25 may be either lateral or substrate transistors but substrate transistors are preferred since the signal in the collector leads of the transistors 24 and 25 is not used and a substrate PNP transistor requires a smaller area in the die layout of a monolithic integrated circuit. Similarly, the pinch resistor 27 is used in order to economize on the die area required for the circuit and also because the pinch resistor can be easily made with a large value of resistance which provides a high gain for the operation of the circuit.

If the comparison circuit consisted only of the transistors 11 and 12 without the transistors 24 and 25, a very low DC signal level applied to the inputs of the circuit would be sufficient to drive the conductive one of the transistors 11 or 12 into saturation, especially with a low reference threshold at or near ground being applied to the base of the reference transistor. By utilizing the Darlington or modified Darlington amplifier configuration for the circuit, the base of the inner transistor, such as the transistor 12, is established at a potential which is one $V_{BE}$ or one $\phi$ above the reference, even when the reference is at ground potential. This then allows the potential on the collector of the transistor 12 to be at least one $\phi$ above ground (for the minimum setting of the tap 33) which is sufficient to forward bias or drive the output transistor 29 into conduction without saturating transistor 12. Without this one $\phi$ voltage allowed on the collector of the transistor 12, it would be difficult to get a DC signal high enough to threshold the $V_{BE}$ of the output transistor 29 without saturating the PNP driving transistor.

In addition to providing this advantage of preventing saturation of the transistors 11 and 12, the Darlington configurations also require a low input current since they present a high input impedance to the inputs connected to the bases of the transistors 24 and 25.

Figure 2:
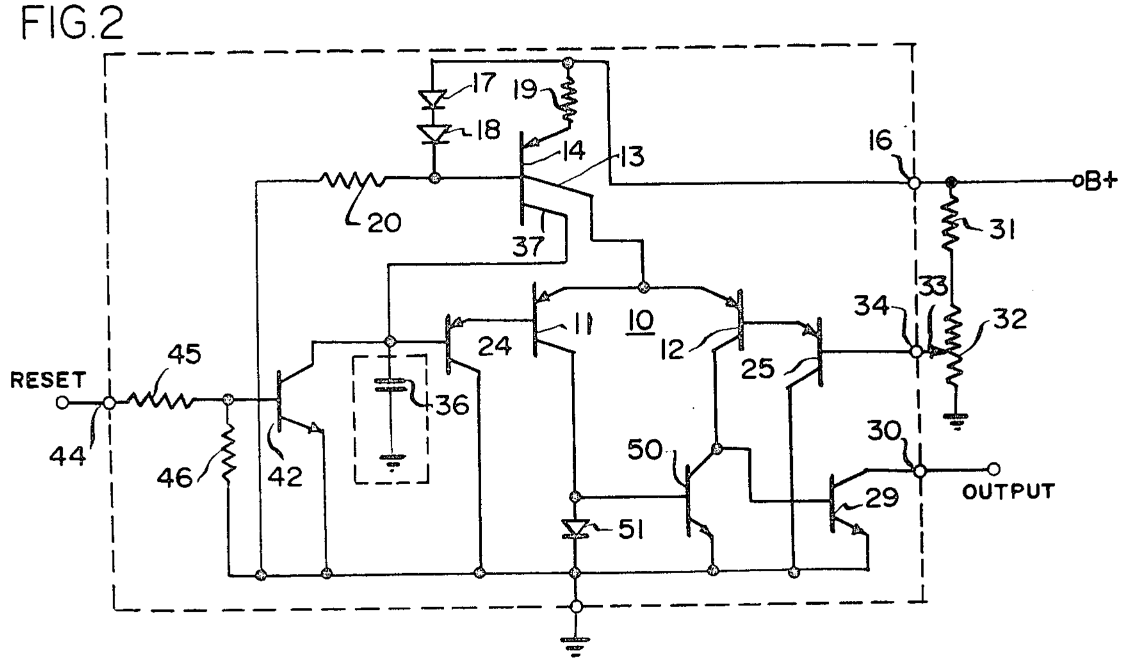
FIG. 2 is a detailed circuit diagram of a variation of the circuit shown in FIG. 1.

Referring now to FIG. 2, there is shown a circuit which is substantially the same as that shown in FIG. 1, but where the pinch resistor 27 has been replaced by an additional NPN transistor 50. The collector-emitter path of the transistor 50 is connected across the base-emitter junction of the transistor 29, and the collector of the transistor 50 is connected to the collector of the transistor 12 in the differential circuit 10. In addition, instead of returning the collector of the transistor 11 directly to the grounded bonding pad 22, a diode 51 is connected between the collector of the transistor 11 and the bonding pad 22. The base of the transistor 50 is connected to the junction of the collector of the transistor 11 and the diode 51. The diode 51 and the transistor 50 then constitute a conventional differential-to-single-ended converter circuit which may be employed to double the gain of the circuit over that which is obtained with the use of the pinch resistor 27 shown in FIG. 1.

When the transistor 11 is conductive and the transistor 12 is nonconductive, a one $\phi$ potential is developed across the diode 51. This biases the transistor 50 into conduction, causing substantially ground potential to be applied to the base of the output transistor 29, rendering it nonconductive. When the transistor 11 is nonconductive and the transistor 12 is conductive, the transistor 50 is nonconductive; so that it operates substantially as an open circuit. This permits the full current from the collector of the transistor 12 to be applied to the base of the transistor 29, driving it into conduction.

It should be noted that the circuits shown in FIGS. 1 and 2 can be fabricated in a very small die area since very few resistors are used in the circuit.

I claim:

1. A comparison circuit including in combination:

first and second voltage supply terminals, one of said supply terminals for connection with a source of DC operating potential and the other of said supply terminals for connection with a point of reference potential;

first and second transistors of the same conductivity type, each having a collector, base, and emitter;

first circuit means connecting said first supply terminal with the emitters of said first and second transistors;

third and fourth transistors of said same conductivity type as said first and second transistors, said third and fourth transistors each having a collector, base, and emitter;

means coupling the emitters of said third and fourth transistors with the bases of said first and second transistors respectively;

semiconductor means comprising diode means coupling the collector of said first transistor with said second supply terminal and comprising fifth transistor means of opposite conductivity type to the conductivity type of said first, second, third and fourth transistors and having a collector, base and emitter, the collector of said fifth transistor means being connected with the collector of said second transistor, the emitter of said fifth transistor means being connected with second supply terminal, and the base of said fifth transistor means being connected with the collector of said first transistor;

further circuit means coupling the collectors of said third and fourth transistors with said second supply terminal;

first input means for applying a first input signal to the base of said third transistor; and second input means for applying a second input signal to the base of said fourth transistor.

2. The combination according to claim 1 wherein said diode means comprises a diode connected between the collector of said first transistor and said second supply terminal and said fifth transistor means comprises a transistor, the collector of which is connected to the collector of said second transistor the emitter of which is connected to said second supply terminal, and the base of which is connected to the collector of said first transistor.

3. The combination according to claim 1 wherein said first, second, third and fourth transistors all are PNP transistors and said first supply terminal is adapted for connection with a positive source of DC operating potential and said second supply terminal is connected to ground.

4. The combination according to claim 1 wherein the comparison circuit is a monolithic integrated circuit and said first, second, third and fourth transistors are PNP transistors, with at least said second transistor being a lateral PNP transistor, and said fifth transistor means is an NPN transistor.

5. The combination according to claim 1 further including a sixth transistor of the same conductivity type as said fifth transistor means and having a collector, base, and emitter, the base of said sixth transistor being connected to the collector of said fifth transistor means, the emitter of said sixth transistor being connected with said second voltage supply terminal, and the collector of said sixth transistor comprising an output terminal for the comparison circuit.

6. The combination according to claim 1 wherein said one voltage supply terminal is adapted for connection with a positive source of DC operating potential, said first circuit means is a current source, one of said first and second input means applies a DC reference input signal and the other of said first and second input means applies a time varying input signal level.

7. The combination according to claim 6 wherein said first input means applies the reference input signal and said second input means applies the time varying input signal level, and said second input means includes a charging circuit and storage capacitor connected together at a junction and in series in the order named between said one voltage supply terminal and said point of reference potential, with said junction being connected to the base of said third transistor.

8. The combination according to claim 7 further including means for discharging said capacitor.

9. A monolithic integrated comparison circuit including in combination:

first and second voltage supply terminals, one of said supply terminals for a connection with a source of DC operating potential and the other of said supply terminals for connection with a point of reference potential;

first and second transistors of the same conductivity type, each having a collector, base, and emitter;

first circuit means connecting said first supply terminal with the emitters of said first and second transistors;

third and fourth transistors of said same conductivity type as said first and second transistors, said third and fourth transistors each having a collector, base, and emitter;

means coupling the emitters of said third and fourth transistors with the bases of said first and second transistors respectively;

pinch resistor means coupling the collector of said second transistor with said second voltage supply terminal;

further circuit means coupling the collectors of said first, third and fourth transistors with said second supply terminal;

a fifth transistor of opposite conductivity type to the conductivity type of said first, second, third and fourth transistors and having a collector, base, and emitter, the base of said fifth transistor being connected to the collector of said second transistor, the emitter of said fifth transistor being connected with said second voltage supply terminal, and the collector of said fifth transistor comprising an output terminal for the comparison circuit;

first input means for applying a first input signal to the base of said third transistor; and second input means for applying a second input signal to the base of said fourth transistor.

10. The combination according to claim 9 wherein the collectors of the first, third and fourth transistors are connected directly with said point of reference potential.

11. The combination according to claim 9 wherein said first, second, third and fourth transistors are PNP transistors, with at least said second transistor being a lateral PNP transistor and said fifth transistor is an NPN transistor.

12. The combination according to claim 11 wherein said first and second transistors are lateral PNP transistors and said third and fourth transistors are substrate PNP transistors.

* * * * *